United States Patent
Katayama et al.

(10) Patent No.: US 7,838,453 B2
(45) Date of Patent: *Nov. 23, 2010

(54) CERAMIC POWDER AND METHOD FOR PRODUCING CERAMIC POWDER

(75) Inventors: Ryoko Katayama, Higashiohmi (JP); Shinichiro Kawada, Hikone (JP)

(73) Assignee: Murata Manufacturing Co., Ltd., Nagaokakyo-shi, Kyoto-fu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/245,129

(22) Filed: Oct. 3, 2008

(65) Prior Publication Data

US 2009/0023578 A1 Jan. 22, 2009

Related U.S. Application Data

(63) Continuation of application No. PCT/JP2007/057441, filed on Apr. 3, 2007.

(30) Foreign Application Priority Data

Apr. 13, 2006 (JP) .............................. 2006-110593

(51) Int. Cl.
   *C04B 35/00* (2006.01)
(52) U.S. Cl. ..................... 501/102; 501/103; 501/126; 501/134; 252/62.9 R; 252/629 PZ
(58) Field of Classification Search ................. 501/102, 501/103, 126, 134; 252/62.9 R, 62.9 PZ
See application file for complete search history.

(56) References Cited

U.S. PATENT DOCUMENTS

| 6,083,415 | A | 7/2000 | Kimura et al. | |
| 2008/0290316 | A1 * | 11/2008 | Katayama et al. | 252/62.9 PZ |

FOREIGN PATENT DOCUMENTS

| JP | 07-082024 | 3/1995 |
| JP | 2002-068835 | 3/2002 |
| JP | 2002-255641 | 9/2002 |
| JP | 2004-091310 | 3/2004 |
| JP | 2004-359539 | 12/2004 |
| JP | 2005-281013 | 10/2005 |
| JP | 2006-060607 | 3/2006 |
| WO | 2005/021461 | * 3/2005 |

OTHER PUBLICATIONS

Translation of Japan 2004-359539, Dec. 2004.*
Translation of WO 2005-021461, Mar. 2005.*
Ken-Ichi Kakimoto, Izumi Masuda, Hitoshi Ohsato. "Ferroelectrict and Piezoelectric Properties of $KNbO_3$ Ceramics Containing Small Amounts of $LaFeO_3$." *Jpn. J. Appl. Phys.* vol. 42 (2003) pp. 6102-6105. The Japan Society of Applied Physics. Sep. 2003.
S. Narayana Murty. "Piezoelectrict $NaKNbO_3$ Ceramics for Ultrasonic Delay Line Applications." *Ferroelectrics*, 1994, vol. 154, pp. 171-176. Gordon and Breach Science Publishers SA. USA.
S.N. Murty, A. Bhanumathi. "Phase Transitions in Europium Doped $(NaK)NbO_3$ Ceramics." *Ferroelectrics*, 1989, vol. 94, pp. 285-290. Gordon and Breach Science Publishers SA, USA.
International Search Report for PCT/JP2007/057441.

* cited by examiner

*Primary Examiner*—Steven Bos
(74) *Attorney, Agent, or Firm*—Dickstein, Shapiro LLP (57) ABSTRACT

A ceramic powder contains a principal component that is a perovskite-type complex oxide represented by the formula $ANbO_3$ (A is at least one selected from alkali metal elements and contains 10 mole percent or more of K) and also contains 0.0001 mole or more of an element per mole of the principal component. The element is at least one selected from the group consisting of Yb, Y, In, Nd, Eu, Gd, Dy, Sm, Ho, Er, Tb, and Lu. The ceramic powder preferably further contains at least one selected from the group consisting of Ti, Zr, and Sn. This enables that a non-deliquescent alkali niobate-based ceramic powder is produced at a high yield.

21 Claims, 2 Drawing Sheets

DIFFRACTION ANGLE 2θ DEGREES

FIG. 3

CERAMIC POWDER AND METHOD FOR PRODUCING CERAMIC POWDER

This is a continuation of application Serial No. PCT/JP2007/057441, filed Apr. 3, 2007.

TECHNICAL FIELD

The present invention relates to ceramic powders and methods for producing the ceramic powders, and particularly relates to a ceramic powder principally containing a niobate compound and a method for producing the ceramic powder.

BACKGROUND ART

In recent years, many attempts have been made to develop ceramic materials for electronic components such as piezoelectric components. In particular, lead-free ceramic materials, which contain no lead, are being investigated in consideration of the environment.

Among the lead-free ceramic materials, niobate compounds, particularly alkali niobates, have high Curie points and large electromechanical coefficients and therefore are expected to be possible ceramic materials for piezoelectric components.

Since the alkali niobates are usually deliquescent, there is a problem in that it is difficult to store and control them.

A piezoelectric ceramic composition containing Bi and an alkali niobate, which is a principal component, has been proposed (Patent Document 1).

As disclosed in Patent Document 1, the addition of Bi to the alkali niobate is effective in preventing the deliquescence of the piezoelectric ceramic composition. This enhances the storage stability of the piezoelectric ceramic composition.

Patent Document 1: Japanese Unexamined Patent Application Publication No. 2005-281013

DISCLOSURE OF INVENTION

Problems to be Solved by the Invention

As disclosed in Patent Document 1, the deliquescence of the piezoelectric ceramic composition, which is a final product, can be prevented by adding Bi to the alkali niobate. However, according to an experiment conducted by the inventors, a ceramic powder (calcined powder), which was an intermediate thereof, containing K serving as an A-site component was deliquescent. This interferes with large-scale production.

The piezoelectric ceramic composition is produced as follows: the ceramic powder is prepared in such a manner that ceramic raw materials are weighed, mixed together, pulverized, and then calcined (heat-treated); the ceramic powder, a binder, an organic solvent, and the like are mixed into slurry; the slurry is formed into a body; and the body is fired.

In the course of producing the piezoelectric ceramic composition, the ceramic powder, which is an intermediate, is not immediately subjected to the next step of mixture with binder and solvent but is usually subjected to the next step after a predetermined lapse of time.

Since the ceramic powder disclosed in Patent Document 1 is deliquescent, it is difficult to store and control the ceramic powder. This interferes with large-scale production.

In general, it is difficult to synthesize alkali niobates containing K, which is an A-site component, at a high yield; hence, unreacted alkali metals, which are not consumed in the synthesis reaction thereof, are likely to remain. Since the alkali metals are soluble in water, the alkali metals need to be pulverized in organic solvents and organic binders need to be used in the forming steps. In the case where ceramic sintered bodies are produced from the alkali niobates on a large scale, explosion-proof apparatuses need to be used. This causes a problem of an increase in production cost.

Since the synthesis yield of the alkali niobates is low as described above, the alkali metals are readily vaporized during firing; hence, the desired compositions may not be obtained because of a shift in composition.

The present invention has been made in view of the foregoing circumstances. It is an object of the present invention to provide an alkali niobate-based ceramic powder which can be synthesized at a high yield and which is non-deliquescent. It is an object of the present invention to provide a method for producing the ceramic powder.

Means for Solving the Problems

Niobate compounds, particularly alkali niobates, have high Curie points and large electromechanical coefficients and therefore are expected to be possible lead-free piezoelectric ceramic materials. In particular, potassium niobate ($KNbO_3$) is known to have especially good piezoelectric properties.

The inventors have intensively investigated alkali niobate-based perovskite-type complex oxides (the formula $ANbO_3$) and have then found that a ceramic powder which can be produced at a high yield and which is non-deliquescent can be obtained when the mole fraction of K in the A-site is adjusted to 10 mole percent or more and a predetermined amount of a trivalent metal element is used.

The present invention has been made on the basis of the above finding. A ceramic powder according to the present invention contains a principal component that is a perovskite-type complex oxide represented by the formula $ANbO_3$ (A is at least one selected from alkali metal elements and contains 10 mole percent or more of K) and also contains 0.0001 mole or more of an element per mole of the principal component. The element is at least one selected from the group consisting of Yb, Y, In, Nd, Eu, Gd, Dy, Sm, Ho, Er, Tb, and Lu.

As a result of further investigation, the inventors have found that the use of a specific tetravalent element such as Ti, Zr, or Sn is effective in achieving a similar advantage. That is, the ceramic powder may further contain at least one member selected from the group consisting of Ti, Zr, and Sn.

A method for producing a ceramic powder according to the present invention includes a mixing step of mixing an A compound containing an alkali metal A containing 10 mole percent or more of K, an Nb compound, and a first compound containing at least one element M1 selected from the group consisting of In, Yb, Y, Nd, Eu, Gd, Dy, Sm, Ho, Er, Tb, and Lu, the A compound, the Nb compound, and the first compound being weighed such that the molar ratio of A to Nb to M1 is 1:1:x (x is 0.0001 or more) and also includes a ceramic powder-preparing step of preparing a ceramic powder by heat-treating the mixture prepared in the mixing step.

In the ceramic powder-producing method, the mixing step can include weighing the A compound, the first compound, and a second compound containing at least one element M2 selected from the group consisting of Ti, Zr, and Sn and also includes mixing the A compound, the first compound, and the second compound.

Advantages

A ceramic powder according to the present invention contains a principal component that is a perovskite-type complex oxide represented by the formula $ANbO_3$ (A is at least one selected from alkali metal elements and containing 10 mole percent or more of K) and also contains 0.0001 mole or more of an element per mole of the principal component and the element is at least one selected from the group consisting of Yb, Y, In, Nd, Eu, Gd, Dy, Sm, Ho, Er, Tb, and Lu; hence, the ceramic powder can be synthesized at a high yield. Therefore, an alkali niobate-based ceramic powder which can be produced by calcination so as to be non-deliquescent and which is readily stored and controlled can be obtained because a water-soluble alkali metal hardly remains after synthesis.

In the ceramic powder, the water-soluble alkali metal hardly remains after synthesis; hence, no organic solvent need to be used in the course of producing a ceramic composition after the synthesis of the ceramic powder. Therefore, an aqueous process can be used, which leads to a reduction in production cost. Furthermore, the following shift is prevented from occurring: a shift in composition due to the vaporization of a metal element by firing in the course of producing the ceramic composition.

The ceramic powder contains a specific tetravalent element (Ti, Zr, or Sn) and therefore can be synthesized at a high yield so as to be non-deliquescent. Therefore, alkali niobate-based ceramic powders having compositions suitable for various applications can be obtained.

A method for producing a ceramic powder according to the present invention includes a mixing step of mixing an A compound containing an alkali metal A containing 10 mole percent or more of K, an Nb compound, and a first compound containing at least one element M1 selected from the group consisting of In, Yb, Y, Nd, Eu, Gd, Dy, Sm, Ho, Er, Tb, and Lu, the A compound, the Nb compound, and the first compound being weighed such that the molar ratio of A to Nb to M1 is 1:1:x (x is 0.0001 or more) and also includes a ceramic powder-preparing step of preparing a ceramic powder by heat-treating the mixture prepared in the mixing step; hence, an alkali niobate-based ceramic powder can be produced at a high synthesis yield and low cost so as to be non-deliquescent.

In the ceramic powder-producing method, the mixing step can include weighing the A compound, the first compound, and a second compound containing a specific tetravalent element M2 (Ti, Zr, or Sn) and also includes mixing the A compound, the first compound, and the second compound; hence, ceramic raw materials weighed in the mixing step include the second compound, which contains at least one metal element M2 selected from the group consisting of Ti, Zr, and Sn. Therefore, an alkali niobate-based ceramic powder having an advantage similar to that described above can be produced at low cost.

According to the ceramic powder and method of the present invention, the following powder can be produced at low cost: an alkali niobate-based ceramic powder which can be readily stored and controlled because of its non-deliquescence and in which no shift in composition is caused by firing in a subsequent step because the yield of synthesis is high and therefore no unreacted alkali metal remains.

BEST MODES FOR CARRYING OUT THE INVENTION

Embodiments of the present invention will now be described in detail.

A ceramic powder according to an embodiment of the present invention contains a principal component which is a perovskite-type complex oxide represented by the formula $ANbO_3$ and also contains 0.0001 mole or more of a specific trivalent element M1 per mole of the principal component.

In the formula, A represents an alkali metal containing 10 mole percent or more of K (potassium). That is, A necessarily contains 10 mole percent or more of K and also can contain at least one selected from the group consisting of Li, Na, Rb, Cs, and Fr, which are alkali metals.

The reason why the A-site contains at least 10 mole percent or more of K is as described below.

Examples of an alkali element forming a solid solution in the A-site include Li, Na, Rb, Cs, and Fr in addition to K as described above. Usually, L11 and/or Na is preferably used. Li and Na have an ionic radius less than that of K. Therefore, when the mole fraction of K in the A-site is less than 10 mole percent, the complex oxide is non-deliquescent or slightly deliquescent. That is, any problem to be solved by the present invention is not present.

Examples of the specific trivalent element M1 include metal elements having ionic radii shown in Table 1.

TABLE 1

| Ions of element M1 | Ionic radius (nm) |
|---|---|
| $Yb^{3+}$ | 0.1008 |
| $Y^{3+}$ | 0.104 |
| $In^{3+}$ | 0.094 |
| $Nd^{3+}$ | 0.1123 |
| $Eu^{3+}$ | 0.1087 |
| $Gd^{3+}$ | 0.1078 |
| $Dy^{3+}$ | 0.1052 |
| $Sm^{3+}$ | 0.1098 |
| $Ho^{3+}$ | 0.1041 |
| $Er^{3+}$ | 0.1033 |
| $Tb^{3+}$ | 0.1063 |
| $Lu^{3+}$ | 0.1001 |

The ionic radii shown in Table 1 conform to those determined by R. D. Shannon (Acta Cryst. A32, 751 (1976)).

The addition of the specific trivalent element M1 to $ANbO_3$ (A is the alkali metal, which contains 10 mole percent or more of K) is effective in increasing the yield of synthesis. Therefore, an unreacted alkali metal, which is not involved in synthesis reaction, hardly remains and a non-deliquescent alkali niobate-based ceramic powder can be obtained.

The reason for the above is probably as described below.

Figure 1:
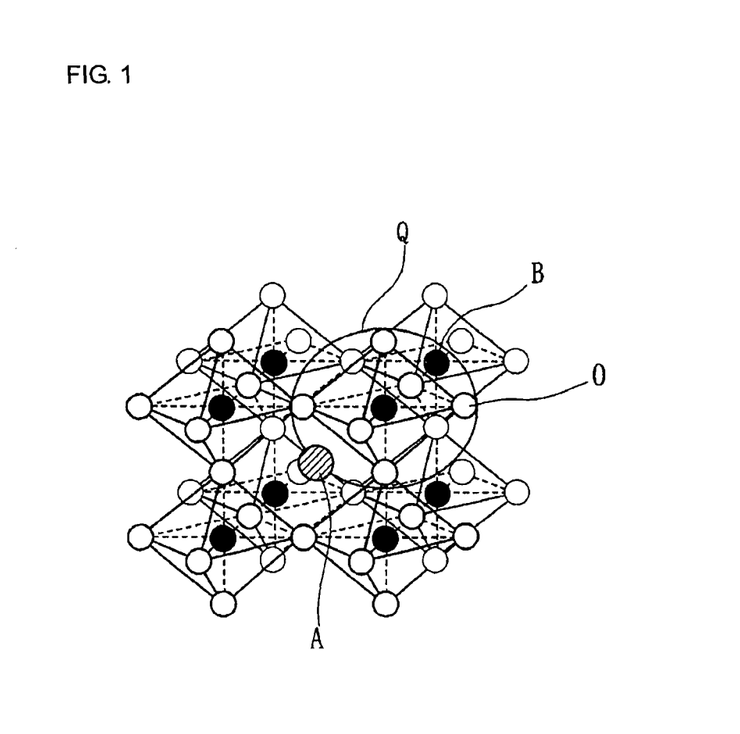
FIG. 1 is a schematic three-dimensional view showing perovskite oxygen octahedrons.

$ANbO_3$ has a perovskite structure. As shown in FIG. 1, the perovskite structure has a framework which consists of oxygen octahedrons centered by B-site ions and which encloses cavities each occupies by an A-site ion. In this figure, Q indicates one of the oxygen octahedrons, filled circles indicate the B-site ions, a hatched circle indicates the A-site ion, and open circles indicate $O^{2-}$ ions.

For $KNbO_3$ in which the A-site is occupied by K, and $K^+$ that is an A-site ion occupies a cavity present in a framework consisting of oxygen octahedrons centered by $Nb^{5+}$ that is a B-site ion.

In the case where it is attempted to synthesize $KNbO_3$ in such a manner that a K compound and an Nb compound are mixed together and the mixture is calcined, $Nb^{5+}$ has an ionic radius of 0.078 nm and $K^+$ has an ionic radius of 0.152 nm, that is, the ionic radius of $K^+$ is far greater than that of $Nb^{5+}$. Furthermore, since the framework of a B-site consists of $Nb^{5+}$, which has a small ionic radius, a cavity in this framework is small. Thus, it is difficult for $K^+$, which has a large ionic radius, to enter the A-site and therefore unreacted K, which forms no solid solution in the A-site and is not involved in synthesis reaction, remains. Hence, it is probably difficult to synthesize $KNbO_3$ at a high yield.

On the other hand, in the case where $In^{3+}$ is added to $KNbO_3$, $In^{3+}$ can more readily enter the A-site as compared to $K^+$ and therefore, when added, in partially substitutes K to form a solid solution in the A-site because $In^{3+}$ has an ionic radius of 0.094 nm, that is, the ionic radius of $In^{3+}$ is far less than the ionic radius (0.152 nm) of $K^+$. Since K is monovalent and In is trivalent, the electric charge are unbalanced. In order to balance the electric charges, a portion of added In forms a solid solution in the B-site to serve as an acceptor. Since the ionic radius (0.094 nm) of $In^{3+}$ is greater than the ionic radius (0.078 nm) of $Nb^{5+}$, a cavity present in a framework consisting of oxygen octahedron is enlarged because In forms a solid solution in the B-site. This allows $K^+$ to enter the A-site; hence, unreacted K, which is not involved in synthesis reaction, hardly remains. Therefore, $KNbO_3$ can be probably produced at a high yield.

It is not preferable to use $La^{3+}$ or $Bi^{3+}$, which is a trivalent element. $La^{3+}$ and $Bi^{3+}$ both have an ionic radius of 0.117 nm. Although $La^{3+}$ and $Bi^{3+}$ are less in ionic radius than $K^+$, the ionic radius of $La^{3+}$ and that of $Bi^{3+}$ are not so small that $La^{3+}$ and $Bi^{3+}$ can readily enter the A-site because a cavity present in a framework consisting of $Nb^{5+}$ is small. Hence, the use of La or Bi is ineffective in achieving an advantage similar to that achieved using the specific element M1 shown in Table 1 and is also ineffective in increasing the yield of synthesis.

The content of the specific trivalent element M1 needs to be 0.0001 mole or more per mole of the principal component. This is because when the content of the specific trivalent element M1 is less than 0.0001 mole per mole of the principal component, the desired advantage can not be achieved.

The upper limit of the content of the specific element M1 is not particularly limited. However, when the content thereof is extremely large, the specific element M1 remains as an impurity because the specific element M1 is not entirely consumed in the substitution of the alkali metal. In particular, when the content of the specific trivalent element M1 is 0.1 mole or more per mole of the principal component, the amount of the specific element M1 remaining as an impurity may be excessively large. Therefore, the content of the specific trivalent element M1 is preferably less than 0.1 mole per mole of the principal component.

The yield of synthesis can be quantitatively evaluated in such a manner that an X-ray diffraction spectrum is obtained using a characteristic X-ray (for example, a Cu—Kα ray) and the maximum peak intensity $I_D$ of a different phase is calculated with respect to the maximum peak intensity $I_{KN}$ of $ANbO_3$.

Figure 2:
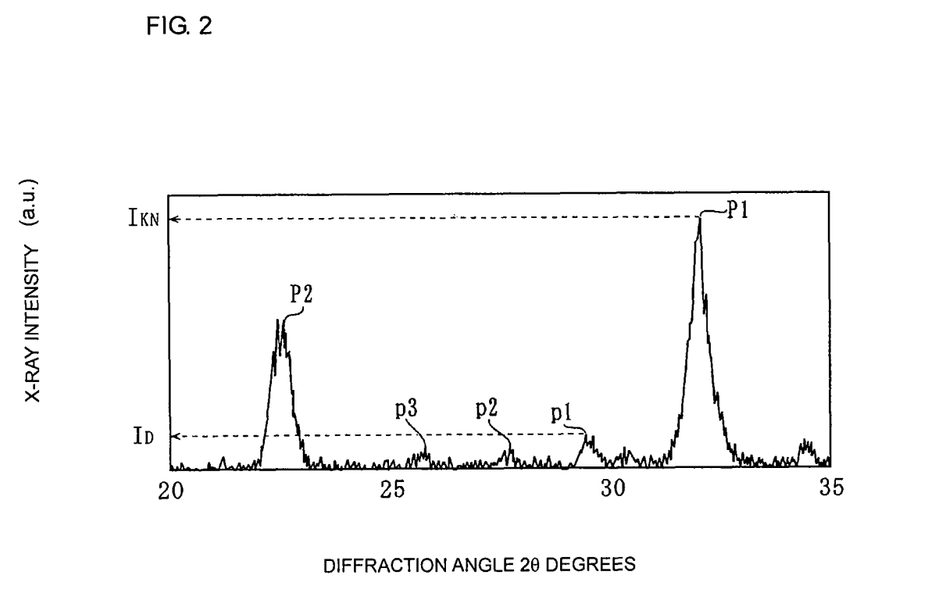
FIG. 2 is a graph showing an X-ray diffraction spectrum used as a reference for determining the yield of synthesis.

FIG. 2 is a graph showing an X-ray diffraction spectrum of the ceramic powder, wherein the abscissa represents the diffraction angle (°) and the ordinate represents the X-ray intensity (a. u.).

When a different phase is present, one or more peaks p1, p2, and p3 corresponding to the different phases are present between the peaks P1 and P2 corresponding to $ANbO_3$ as shown in FIG. 2. The yield of the synthesis of $ANbO_3$ can be quantitatively calculated in such a manner that the ratio X of the intensity (maximum peak intensity) $I_D$ of the maximum peak of the different phase to the intensity (maximum peak intensity) $I_{KN}$ of the maximum peak of $ANbO_3$ is determined from Equation (1) below.

$$X=(I_D/I_{KN})\times 100 \tag{1}$$

When $ANbO_3$ is deliquescent, a solution thereof is alkaline; hence, whether $ANbO_3$ is deliquescent can be determined using a strip of pH test paper.

When the yield of the synthesis of the ceramic powder, which principally contains $ANbO_3$, is low and therefore the unreacted alkali metal remains, the alkali metal reacts with $CO_2$ in air to produce a carbonate ($A_2CO_3$).

The carbonate of the alkali metal reacts with water to produce hydroxy ions as illustrated by Chemical Equation (A) below and therefore is alkaline.

$$A_2CO_3+2H_2O\rightarrow 2A^++H_2CO_3+2OH^- \tag{A}$$

Since the carbonate of the alkali metal is deliquescent as well known, whether $ANbO_3$ is deliquescent can be determined in such a manner that a strip of pH test paper is contacted with an aqueous solution of $A_2CO_3$ and the change in color of the pH test paper strip is then observed.

The ceramic powder of this embodiment contains 0.0001 mole or more of the specific trivalent element M1 per mole of the principal component, which is represented by the formula $ANbO_3$ (A is the alkali metal, which contains 10 mole percent or more of K), and therefore can be synthesized at a high yield; hence, a water-soluble alkaline substance can be substantially prevented from remaining after the synthesis thereof. This allows the ceramic powder to be non-deliquescent; hence, the ceramic powder can be readily stored and controlled.

Since such a water-soluble alkaline substance hardly remains after the synthesis thereof, no organic solvent needs to be used but an aqueous process can be used in the course of producing a piezoelectric ceramic composition. This leads to a reduction in production cost.

Since the unreacted alkali metal does not remain, no shift in composition is caused by the vaporization of the alkali metal in a firing step in the course of producing the piezoelectric ceramic composition.

A method for producing the ceramic powder will now be described in detail.

The following compounds are prepared and used as ceramic raw materials: an alkali metal compound containing the alkali metal A, which contains 10 mole percent or more of K, and a first compound containing the specific trivalent element M1.

The ceramic raw materials are weighed such that the composition of the ceramic powder satisfies the requirement that the molar ratio of A to Nb to M1 is 1:1:x (x is 0.0001 or more and is preferably less than 0.1). The weighed materials are charged into a ball mill together with an organic solvent such as ethanol and a pulverization medium such as PSZ (partially stabilized zirconia) and then wet-mixed together in the organic solvent. The obtained mixture is dried and then calcined (heat-treated) at a temperature of 700° C. to 1000° C. for one to ten hours, whereby the ceramic powder can be produced.

In this embodiment, the ceramic powder is produced in such a manner that after the ceramic raw materials are weighed such that the molar ratio of the alkali metal A to Nb to the specific trivalent element M1 is 1:1:x (x is 0.0001 or more), the weighed materials are mixed together and the mixture is then calcined. This enables that the ceramic powder is readily produced at a high yield so as to be non-deliquescent. Therefore, an alkali niobate-based ceramic powder suitable for the large-scale production of ceramic electronic components such as piezoelectric components can be obtained.

A ceramic powder according to a second embodiment of the present invention will now be described.

The ceramic powder of the second embodiment contains a specific tetravalent element M2 in addition to those described in the first embodiment. This enables the ceramic powder, as well as that of the first embodiment, is produced at a high yield so as to be non-deliquescent.

Examples of the specific tetravalent element M2 include metal elements, such as Ti, Zr, and Sn, having ionic radii close to the ionic radius (0.078 nm) of $Nb^{5+}$ as shown in Table 2.

TABLE 2

| Ions of element M2 | Ionic radius (nm) |
|---|---|
| $Ti^{4+}$ | 0.075 |
| $Zr^{4+}$ | 0.086 |
| $Sn^{4+}$ | 0.083 |

The ionic radii shown in Table 2, as well as those shown in Table 1, conform to those determined by R. D. Shannon.

Since the specific tetravalent metal element M4 is added to $ANbO_3$ in addition to a specific trivalent element M1, the ceramic powder, as well as that of the first embodiment, can be produced at a high yield so as to be non-deliquescent.

The reason for the above is probably as described below.

In the case where, for example, $In^{3+}$ and $Ti^{4+}$ are added to $KNbO_3$, $In^{3+}$ forms a solid solution in an A-site and $Ti^{4+}$ forms a solid solution in a B-site because of the relationship between the ionic radius of $In^{3+}$ and that of $Ti^{4+}$. This allows electric charges to be balanced. If In occupies the A-site, the electric charges are unbalanced because K is monovalent and In is trivalent. However, $Ti^{4+}$, which has an ionic radius close to that of $Nb^{5+}$, predominantly occupies the B-site. That is, Ti serves as an acceptor to form a solid solution in the B-site. This allows the electric charges to be balanced.

In the comparison between the ionic radius (0.152 nm) of $K^+$ and the ionic radius (0.094 nm) of $In^{3+}$, the ionic radius of $In^{3+}$ is smaller. Although In, which has a smaller ionic radius, enters the A-site, a large space other than a space occupied by In remains in the A-site. This enables that K, which has a larger ionic radius, readily enters the A-site to form a solid solution; hence, no unreacted K remains. This leads to an increase in the yield of synthesis as described in the first embodiment.

The content of the specific tetravalent element M2 is not particularly limited. Even if the content of the specific tetravalent element M2 is excessively small, a portion of the specific trivalent element M1, which is necessarily contained in the ceramic powder, serves as an acceptor and enters the B-site; hence, a cavity in a framework consisting of oxygen octahedrons is expanded and K readily forms a solid solution in the A-site. On the other hand, in the case where the ceramic powder contains an appropriate amount of the specific tetravalent metal element M2 in addition to the specific trivalent element M1, electric charges are balanced by the specific tetravalent element M2 and K readily forms a solid solution in the A-site because a portion of the A-site other than a portion occupied by the specific trivalent element M1 is expanded. That is, the presence of the specific trivalent element M1 allows K to form a solid solution in the A-site independently of the presence of the specific tetravalent element M2. Therefore, the content of the specific tetravalent element M2 is not particularly limited.

When the content of the specific tetravalent element M2 is excessive, the specific tetravalent element M2 remains as an impurity because the specific tetravalent element M2 is not entirely consumed in the substitution of Nb. In particular, when the amount of specific tetravalent element M2 contained in the ceramic powder is 0.1 mole or more per mole of a principal component, a large amount of the specific tetravalent element M2 may remain as an impurity. Therefore, the amount of the specific tetravalent element M2 contained therein is preferably less than 0.1 mole per mole of the principal component.

In the second embodiment, the ceramic powder can be produced by substantially the same method or procedure as that described in the first embodiment.

The following compounds are prepared and used as ceramic raw materials: an alkali metal compound containing the alkali metal A, which contains 10 mole percent or more of K, a first compound containing the specific trivalent element M1, and a second compound containing the specific tetravalent element M2.

The ceramic raw materials are weighed such that the composition of the ceramic powder satisfies the requirement that the molar ratio of A to Nb to M1 to M2 ratio is 1:1:x:y (x is 0.0001 or more and is preferably less than 0.1 and y is an arbitrary mole number). The weighed materials are charged into a ball mill together with an organic solvent such as ethanol and a pulverization medium such as PSZ and then wet-mixed together in the organic solvent. The obtained mixture is dried and then calcined (heat-treated) at a temperature of 700° C. to 1000° C. for one to ten hours, whereby the ceramic powder is produced.

In the second embodiment, a desired alkali niobate-based ceramic powder can be produced at a high yield and low cost. The alkali niobate-based ceramic powder is non-deliquescent and has good storage stability. Therefore, alkali niobate-based ceramic powders having compositions suitable for various applications can be obtained.

The present invention is not limited to the above embodiments. For example, an alkali compound, specific trivalent element M1, and specific tetravalent element M2 used herein are not particularly limited and a carbonate, an oxide, or the like can be used.

Examples of the present invention will now be described in detail.

EXAMPLE 1

The following compounds were prepared and used as ceramic raw materials: $K_2CO_3$, $Nb_2O_5$, $Yb_2O_3$, $Y_2O_3$, $In_2O_3$, $Nd_2O_3$, $Eu_2O_3$, $Gd_2O_3$, $Dy_2O_3$, $Sm_2O_3$, $Ho_2O_3$, $Er_2O_3$, $Tb_2O_3$, $Lu_2O_3$, $La_2O_3$, and $Bi_2O_3$.

The ceramic raw materials were weighed so as to have compositions shown in Table 3, the compositions being represented by the formula $KNbO_3+xM1O_{3/2}$.

The weighed materials were charged into a ball mill together with ethanol and PSZ and then wet-mixed together in ethanol. The obtained mixture was dried and then calcined 900° C. for two hours. Samples 1 to 20 (ceramic powders) were prepared by the above procedure.

The X-ray diffraction spectrum of each sample was measure with an X-ray diffractometer using a Cu—Kα X-ray source immediately after calcination. The ratio X of the maximum peak intensity $I_D$ of a different phase to the maximum peak intensity $I_{KN}$ of $ANbO_3$ was calculated, whereby the yield of the synthesis of the sample was evaluated.

From each sample, 3 g of a specimen was taken immediately after calcination and 3 g of another specimen was taken after a lapse of 1000 hours from calcination. Each specimen was placed into 500 cc of pure water, which was stirred. The specimen-water mixture was measured for pH using a strip of pH test paper, whereby the deliquescence of the sample was evaluated.

Table 3 summarizes the compositions and measurements of Samples 1 to 20.

In Table 3, a sample with an intensity ratio other than 0% is evaluated to have a different phase and a sample with a pH of 7, which is neutral, is evaluated to be non-deliquescent.

TABLE 3

| Sample No. | Compositions: $KNbO_3 + xM1O_{3/2}$ | | Intensity ratio (%) | Immediately after calcination pH | After a lapse of 1000 hours from calcination pH |
| --- | --- | --- | --- | --- | --- |
| | x | M1 | | | |
| 1 | 0.02 | Yb | 0 | 7 | 7 |
| 2 | 0.02 | Y | 0 | 7 | 7 |
| 3 | 0.02 | In | 0 | 7 | 7 |
| 4 | 0.02 | Nd | 0 | 7 | 7 |
| 5 | 0.02 | Eu | 0 | 7 | 7 |
| 6 | 0.02 | Gd | 0 | 7 | 7 |
| 7 | 0.02 | Dy | 0 | 7 | 7 |
| 8 | 0.02 | Sm | 0 | 7 | 7 |
| 9 | 0.02 | Ho | 0 | 7 | 7 |
| 10 | 0.02 | Er | 0 | 7 | 7 |
| 11 | 0.02 | Tb | 0 | 7 | 7 |
| 12 | 0.02 | Lu | 0 | 7 | 7 |
| 13* | 0.02 | La | 14.1 | 12 | 13 |
| 14* | 0.02 | Bi | 14.1 | 12 | 13 |
| 15* | 0 | — | 14.1 | 12 | 13 |
| 16 | 0.0001 | Yb | 0.3 | 7 | 7.5 |
| 17 | 0.001 | Yb | 0 | 7 | 7 |
| 18 | 0.01 | Yb | 0 | 7 | 7 |
| 19 | 0.05 | Yb | 0 | 7 | 7 |
| 20 | 0.1 | Yb | 0 | 7 | 7 |

Asterisked samples are outside the scope of the present invention.

Samples 1 to 12 contain specific elements M1 that are within the scope of the present invention; hence, these samples have an intensity ratio of 0%, that is, these samples have no different phase. Furthermore, the following specimens have a pH of 7, which is neutral: specimens taken from these samples immediately after calcination and specimens taken from these samples after a lapse of 1000 hours from calcination. This shows that these samples are non-deliquescent. This is because the specific elements M1 have an ionic radius of 0.094 to 0.1123 nm, that is, the ionic radii of the specific elements M1 are greater than the ionic radius (0.078 nm) of $Nb^{5+}$ but less than the ionic radius (0.152 nm) of $K^+$; hence, each specific element M1 forms a solid solution in an A-site with respect to the framework of a B-site consisting of $Nb^{5+}$ and a portion thereof serves as an acceptor to occupies the B-site and also forms a solid solution in the B-site. Since the specific element M1 occupies the B-site, a cavity present in a framework consisting of oxygen octahedrons is expanded and $K^+$ forms a solid solution in the A-site. This prevents unreacted K, which is not involved in synthesis reaction, from remaining. This probably leads to an increase in the yield of synthesis.

Sample 16 contains 0.0001 mole of a specific element M1 per mole of $KNbO_3$ and therefore has an intensity ratio of 0.3%, which shows that this sample has substantially no different phase. A specimen taken from this sample immediately after calcination has a pH of 7, which is neutral. A specimen taken from this sample after a lapse of 1000 hours from calcination has a pH of 7.5, which is substantially neutral.

Samples 17 to 20 each contain 0.001 mole or more of a specific element M1 per mole of $KNbO_3$ and therefore have an intensity ratio of 0%, which shows that these samples have substantially no different phase. The following specimens have a pH of 7: specimens taken from these samples immediately after calcination and specimens taken from these samples after a lapse of 1000 hours from calcination. These show that the yield of the synthesis of these samples is high and these samples are non-deliquescent.

Sample 13 contains La in place of a M1 element and is outside the scope of the present invention and therefore has an intensity ratio X of 14.1%, that is, this sample has different phases. This shows that the yield of the synthesis of this sample is low. A specimen taken from this sample immediately after calcination has a pH of 12, which is alkaline. A specimen taken from this sample after a lapse of 1000 hours from calcination has a pH of 13, which is alkaline. These show that this sample is deliquescent. This is because $La^{3+}$ has a large ionic radius of 0.117 nm and therefore it is difficult for La to enter an A-site with respect to a framework consisting of $Nb^{5+}$; hence, this sample does not have the advantage that can be achieved using a specific element M1 which is within the scope of the present invention. Therefore, the yield of the synthesis of this sample cannot be increased and this sample cannot avoid being deliquescent.

Sample 14 contains Bi instead of an element M1, and is outside the scope of the present invention, and therefore has an intensity ratio X of 14.1%, that is, this sample has a different phase. This shows that the yield of the synthesis of this sample is low. A specimen taken from this sample immediately after calcination has a pH of 12, which is alkaline. A specimen taken from this sample after a lapse of 1000 hours from calcination has a pH of 13, which is alkaline. These show that this sample is deliquescent. This is because $Bi^{3+}$, as well as $La^{3+}$, has a large ionic radius of 0.117 nm and therefore this sample does not have an advantage that can be achieved using a specific element which is within the scope of the present invention from the same reason as that for Sample 13. Therefore, the yield of the synthesis of this sample cannot be increased and this sample cannot avoid being deliquescent.

Sample 15 contains $KNbO_3$ only and therefore has an intensity ratio X of 14.1%, that is, this sample has a different phase. This shows that the yield of the synthesis of this sample is low. A specimen taken from this sample immediately after calcination has a pH of 12, which is alkaline. A specimen taken from this sample after a lapse of 1000 hours from calcination has a pH of 13, which is alkaline. These show that this sample is deliquescent. This is because the framework of a B-site consists of $Nb^{5+}$ having an ionic radius less than that of $K^+$ and therefore a cavity present in the framework is small; hence, it is difficult for $K^+$, which has a large ionic radius, to enter an A-site. Therefore, unreacted K, which is not involved in synthesis reaction, remains; the yield of the synthesis of this sample cannot be increased; and this sample is deliquescent.

Figure 3:
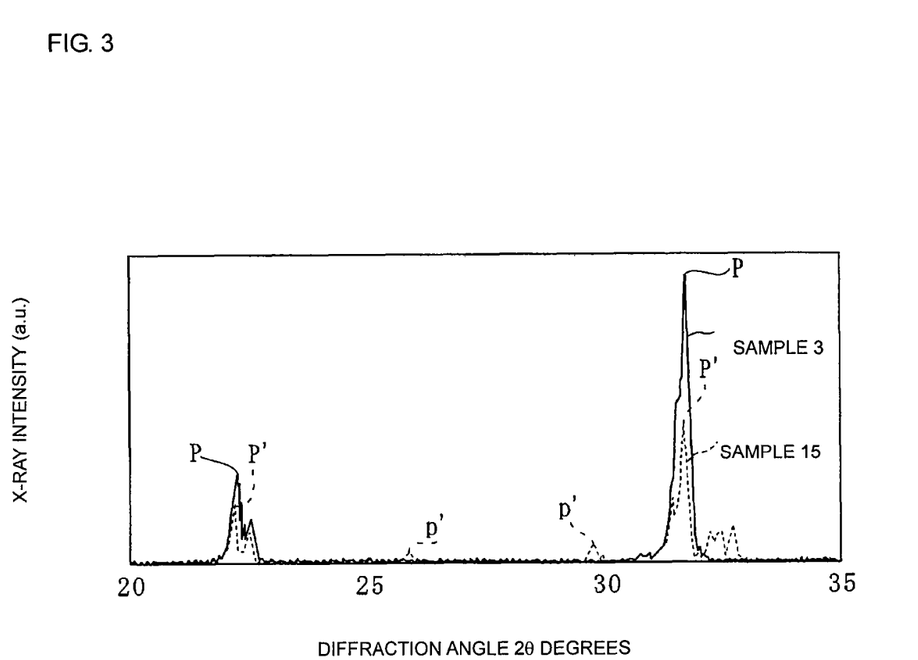
FIG. 3 is a graph showing the X-ray diffraction spectra of Samples 3 and 15.

FIG. 3 shows the X-ray diffraction spectra of Samples 3 and 15, wherein the solid line indicates the X-ray diffraction spectrum of Sample 3, the broken line indicates the X-ray diffraction spectrum of Sample 15, the abscissa represents the diffraction angle (°), and the ordinate represents the X-ray intensity.

As is clear from FIG. 3, Sample 15 has a peak p' corresponding to the above different phase and a small peak P' corresponding to $KNbO_3$ and therefore has a large intensity ratio X, that is, the yield of the synthesis of this sample is low.

On the other hand, Sample 3 has no different phase and has a large peak P' corresponding to $KNbO_3$ and therefore has an intensity ratio X of 0%, that is, the yield of the synthesis of this sample is high.

EXAMPLE 2

$Na_2CO_3$ was prepared in addition to the ceramic raw materials described in Example 1. Samples 21 to 42 (ceramic powders) were produced by the same method or procedure as that described in Example 1 so as to have compositions represented by the formula $\{(K_{1-\alpha}Na_\alpha)NbO_3+xM1O_{3/2}\}$, wherein $\alpha$ is 0.5 or 0.9.

Samples 21 to 42 were measured for intensity ratio X and the following specimens were measured for pH by the same method or procedure as that described in Example 1: specimens taken from Samples 21 to 42 immediately after calcination and specimens taken from Samples 21 to 42 after a lapse of 1000 hours from calcination.

Table 4 summarizes the compositions and measurements of Samples 21 to 42.

TABLE 4

| Sample No. | Compositions: $(K_{1-\alpha}Na_\alpha)NbO_3 + xM1O_{3/2}$ | | | Intensity ratio (%) | Immediately after calcination pH | After a lapse of 1000 hours from calcination pH |
|---|---|---|---|---|---|---|
| | α | x | M1 | | | |
| 21 | 0.5 | 0.02 | Yb | 0 | 7 | 7 |
| 22 | 0.5 | 0.02 | Y | 0 | 7 | 7 |
| 23 | 0.5 | 0.02 | In | 0 | 7 | 7 |
| 24 | 0.5 | 0.02 | Nd | 0 | 7 | 7 |
| 25 | 0.5 | 0.02 | Eu | 0 | 7 | 7 |
| 26 | 0.5 | 0.02 | Gd | 0 | 7 | 7 |
| 27 | 0.5 | 0.02 | Dy | 0 | 7 | 7 |
| 28 | 0.5 | 0.02 | Sm | 0 | 7 | 7 |
| 29 | 0.5 | 0.02 | Ho | 0 | 7 | 7 |
| 30 | 0.5 | 0.02 | Er | 0 | 7 | 7 |
| 31 | 0.5 | 0.02 | Tb | 0 | 7 | 7 |
| 32 | 0.5 | 0.02 | Lu | 0 | 7 | 7 |
| 33* | 0.5 | 0.02 | La | 14.4 | 12 | 13 |
| 34* | 0.5 | 0.02 | Bi | 14.3 | 12 | 13 |
| 35* | 0.5 | 0 | — | 14.3 | 12 | 13 |
| 36 | 0.5 | 0.0001 | Yb | 0.3 | 7 | 7.6 |
| 37 | 0.5 | 0.001 | Yb | 0 | 7 | 7 |
| 38 | 0.5 | 0.01 | Yb | 0 | 7 | 7 |
| 39 | 0.5 | 0.05 | Yb | 0 | 7 | 7 |
| 40 | 0.5 | 0.1 | Yb | 0 | 7 | 7 |
| 41 | 0.9 | 0.001 | Yb | 0 | 7 | 7 |
| 42* | 0.9 | 0 | — | 12.2 | 11 | 13 |

Asterisked samples are outside the scope of the present invention.

Samples 21 to 32, as well as Samples 1 to 12 described in Example 1, contain elements M1 that are within the scope of the present invention; hence, these samples have an intensity ratio of 0%, that is, these samples have no different phase. Furthermore, the following specimens have a pH of 7, which is neutral: specimens taken from these samples immediately after calcination and specimens taken from these samples after a lapse of 1000 hours from calcination. This shows that these samples are non-deliquescent.

Sample 36 contains 0.0001 mole of an element M1 per mole of $(K_{0.5}Na_{0.5})NbO_3$ and therefore has an intensity ratio of 0.3%, which shows that this sample has substantially no different phase. A specimen taken from this sample immediately after calcination has a pH of 7, which is neutral. A specimen taken from this sample after a lapse of 1000 hours from calcination has a pH of 7.6, which is substantially neutral.

Samples 37 to 40 each contain 0.001 mole or more of a specific element M1 per mole of $(K_{0.5}Na_{0.5})NbO_3$ and therefore have an intensity ratio of 0%, which shows that these samples have no different phase. The following specimens have a pH of 7: specimens taken from these samples immediately after calcination and specimens taken from these samples after a lapse of 1000 hours from calcination. These show that the yield of the synthesis of these samples is high and these samples are non-deliquescent.

Sample 41 contains 0.001 mole of Yb that is a specific element M1 per mole of $(K_{0.1}Na_{0.9})NbO_3$ and has an intensity ratio of 0%, which shows that this sample has no different phase. The following specimens have a pH of 7: specimens taken from these samples immediately after calcination and specimens taken from these samples after a lapse of 1000 hours from calcination. Although the mole fraction of K in an A-site is 10 mole percent, the yield of the synthesis of this sample is high and this sample is non-deliquescent because this sample contains 0.001 mole of Yb per mole of $(K_{0.1}Na_{0.9})NbO_3$.

On the other hand, Sample 33 contains La which is not an element M1 and which is outside the scope of the present invention and therefore has an intensity ratio of 14.4%, that is, this sample has a different phase from the same reason as that for Sample 13. This shows that the yield of the synthesis of this sample is low. A specimen taken from this sample immediately after calcination has a pH of 12, which is alkaline. A specimen taken from this sample after a lapse of 1000 hours from calcination has a pH of 13, which is alkaline. These show that this sample is deliquescent.

Sample 34 contains Bi which is not an element M1 and which is outside the scope of the present invention and therefore has an intensity ratio of 14.3%, that is, this sample has a different phase from the same reason as that for Sample 14 described in Example 1. This shows that the yield of the synthesis of this sample is low. A specimen taken from this sample immediately after calcination has a pH of 12, which is alkaline. A specimen taken from this sample after a lapse of 1000 hours from calcination has a pH of 13, which is alkaline. These show that this sample is deliquescent.

Sample 35 contains no specific element M1 but $(K_{0.5}Na_{0.5})NbO_3$ only and therefore has an intensity ratio of 14.3%, that is, this sample has a different phase from the same reason as that for Sample 15 described in Example 1. This shows that the yield of the synthesis of this sample is low. A specimen taken from this sample immediately after calcination has a pH of 12, which is alkaline. A specimen taken from this sample after a lapse of 1000 hours from calcination has a pH of 13, which is alkaline. These show that this sample is deliquescent.

Sample 42 contains no specific element M1 but $(K_{0.1}Na_{0.9})NbO_3$ only and therefore has an intensity ratio of 12.2%, that is, this sample has a different phase from the same reason as that for Sample 35. This shows that the yield of the synthesis of this sample is low. A specimen taken from this sample immediately after calcination has a pH of 11, which is alkaline. A specimen taken from this sample after a lapse of 1000 hours from calcination has a pH of 13, which is alkaline. These show that this sample is deliquescent.

EXAMPLE 3

The following compounds were prepared and used as ceramic raw materials: $K_2CO_3$, $Na_2CO_3$, $Nb_2O_5$, $Yb_2O_3$, $TiO_2$, $ZrO_2$, and $SnO_2$.

The ceramic raw materials were weighed so as to have compositions shown in Table 5, the compositions being represented by the formula $ANbO_3+0.02YbO_{3/2}+0.04M2O_2$.

Samples 51 to 56 (ceramic powders) were produced by the same method of procedure as that described in Example 1

Samples 51 to 56 were measured for intensity ratio X and the following specimens were measured for pH by the same method or procedure as that described in Example 1: specimens taken from Samples 51 to 56 immediately after calcination and specimens taken from Samples 51 to 56 after a lapse of 1000 hours from calcination.

Table 5 summarizes the compositions and measurements of Samples 51 and 56.

TABLE 5

| Sample No. | Compositions: $ANbO_3 + 0.02YbO_{3/2} + 0.04M2O_2$ | | Intensity ratio (%) | Immediately after calcination pH | After a lapse of 1000 hours from calcination pH |
|---|---|---|---|---|---|
| | A | M2 | | | |
| 51 | K | Ti | 0 | 7 | 7 |
| 52 | K | Zr | 0 | 7 | 7 |
| 53 | K | Sn | 0 | 7 | 7 |
| 54 | $K_{0.5}Na_{0.5}$ | Ti | 0 | 7 | 7 |
| 55 | $K_{0.5}Na_{0.5}$ | Zr | 0 | 7 | 7 |
| 56 | $K_{0.5}Na_{0.5}$ | Sn | 0 | 7 | 7 |

As is clear from Table 5, these samples contain a tetravalent element M such as Ti, Zr, or Sn in addition to the elements contained in Sample 1 or 21 and have an intensity ratio of 0%, which shows that these samples have no different phase. The following specimens have a pH of 7, which is neutral: specimens taken from these samples immediately after calcination and specimens taken from these samples after a lapse of 1000 hours from calcination. This shows that these samples are non-deliquescent.

EXAMPLE 4

The following compounds were prepared and used as ceramic raw materials: $K_2CO_3$, $Na_2CO_3$, $Nb_2O_5$, $Yb_2O_3$, and $TiO_2$.

The ceramic raw materials were weighed so as to have compositions shown in Table 5, the compositions being represented by the formula $ANbO_3+0.02YbO_{3/2}+yTiO_2$.

Samples 61 to 70 (ceramic powders) were produced by the same method of procedure as that described in Example 1

Samples 61 to 70 were measured for intensity ratio X and the following specimens were measured for pH by the same method or procedure as that described in Example 1: specimens taken from Samples 61 to 70 immediately after calcination and specimens taken from Samples 61 to 70 after a lapse of 1000 hours from calcination.

Table 6 summarizes the compositions and measurements of Samples 61 and 70.

TABLE 6

| Sample No. | Compositions: $ANbO_3 + 0.02YbO_{3/2} + yTiO_2$ | | Intensity ratio (%) | Immediately after calcination pH | After a lapse of 1000 hours from calcination pH |
|---|---|---|---|---|---|
| | A | y | | | |
| 61 | K | 0.0001 | 0 | 7 | 7 |
| 62 | K | 0.001 | 0 | 7 | 7 |
| 63 | K | 0.01 | 0 | 7 | 7 |
| 64 | K | 0.05 | 0 | 7 | 7 |
| 65 | K | 0.1 | 0 | 7 | 7 |
| 66 | $K_{0.5}Na_{0.5}$ | 0.0001 | 0 | 7 | 7 |
| 67 | $K_{0.5}Na_{0.5}$ | 0.001 | 0 | 7 | 7 |
| 68 | $K_{0.5}Na_{0.5}$ | 0.01 | 0 | 7 | 7 |
| 69 | $K_{0.5}Na_{0.5}$ | 0.05 | 0 | 7 | 7 |
| 70 | $K_{0.5}Na_{0.5}$ | 0.1 | 0 | 7 | 7 |

As is clear from Table 5, these samples contain 0.0001 to 0.1 mole Ti per mole of $ANbO_3$ and have an intensity ratio of 0%, which shows that these samples have no different phase. The following specimens have a pH of 7, which is neutral: specimens taken from these samples immediately after calcination and specimens taken from these samples after a lapse of 1000 hours from calcination. This shows that these samples are non-deliquescent.

The invention claimed is:

1. A calcined ceramic powder containing:
   a principal component that is a perovskite complex oxide represented by the formula $ANbO_3$, A being at least one alkali metal element of which 10 mole percent or more is K; and
   0.0001 mole or more per mole of the principal component of at least one member selected from the group consisting of Yb, Y, In, Nd, Eu, Gd, Dy, Sm, Ho, Er, Tb, and Lu, said powder being non-deliquescent.

2. The ceramic powder according to claim 1, further containing at least one member selected from the group consisting of Ti, Zr, and Sn.

3. The ceramic powder according to claim 2, in which the at least one member selected from the group consisting of Yb, Y, In, Nd, Eu, Gd, Dy, Sm, Ho, Er, Tb, and Lu is less than 0.1 mole per mole.

4. The ceramic powder according to claim 3, in which the at least one member selected from the group consisting of Ti, Zr, and Sn is less than 0.1 mole per mole of principal component.

5. The ceramic powder according to claim 4, in which A is a combination of K and at least one of Na or Li.

6. The ceramic powder according to claim 4, in which A is a combination of K and Na.

7. The ceramic powder according to claim 6, in which the principal component is $(K_{1-\alpha}Na_\alpha)NbO_3$ in which $\alpha$ is 0.5 to 0.9.

8. The ceramic powder according to claim 4, in which A is K.

9. The ceramic powder according to claim 2, in which the at least one member selected from the group consisting of Ti, Zr, and Sn is less than 0.1 mole per mole of principal component.

10. The ceramic powder according to claim 2, in which A is K or a combination of K and at least one of Na or Li.

11. The ceramic powder according to claim 1, in which A is K or a combination of K and at least one of Na or Li.

12. The ceramic powder according to claim 1, in which A is a combination of K and Na.

13. The ceramic powder according to claim 1, in which the principal component is $(K_{1-\alpha}Na_\alpha)NbO_3$ in which $\alpha$ is 0.5 to 0.9.

14. The ceramic powder according to claim 1, in which the at least one member is selected from the group consisting of Yb, Y, In, Nd, Gd, Dy, Ho, Er, Tb, and Lu, and the amount thereof is less than 0.1 mole per mole.

15. A method for producing a calcined ceramic powder which is non-deliquescent, comprising:
heat-treating in a single calcination step a mixture of a compound containing at least one alkali metal A of which at least 10 mole percent or more is K, an Nb compound, and a first compound containing at least one element M1 selected from the group consisting of In, Yb, Y, Nd, Eu, Gd, Dy, Sm, Ho, Er, Tb, and Lu, wherein the A compound, the Nb compound, and the first compound are in a molar ratio of A to Nb to M1 of 1:1: x, and x is 0.0001 or more.

16. The ceramic powder-producing method according to claim 15, wherein x is less than 0.1.

17. The ceramic powder-producing method according to claim 15, wherein the mixture also contains a second compound containing at least one element M2 selected from the group consisting of Ti, Zr, and Sn.

18. The ceramic powder-producing method according to claim 17, wherein the amount of the second compound is less than 0.1, and x is less than 0.1.

19. The ceramic powder-producing method according to claim 18, wherein the mixture is free of organic solvent.

20. The ceramic powder-producing method according to claim 15, wherein the mixture is free of organic solvent.

21. The ceramic powder-producing method according to claim 15, in which the at least one element is selected from the group consisting of Yb, Y, In, Nd, Gd, Dy, Ho, Er, Tb, and Lu, and x is less than 0.1 mole per mole.

* * * * *